(12) United States Patent
Parise

(10) Patent No.: US 6,986,247 B1
(45) Date of Patent: *Jan. 17, 2006

(54) THERMOELECTRIC CATALYTIC POWER GENERATOR WITH PREHEAT

(76) Inventor: Ronald J. Parise, 101 Wendover Rd., Suffield, CT (US) 06078

( * ) Notice: Subject to any disclaimer, the term of this patent is extended or adjusted under 35 U.S.C. 154(b) by 675 days.

This patent is subject to a terminal disclaimer.

(21) Appl. No.: 10/113,459

(22) Filed: Mar. 28, 2002

Related U.S. Application Data

(63) Continuation-in-part of application No. 09/419,995, filed on Oct. 18, 1999, now abandoned, which is a continuation of application No. 08/933,663, filed on Sep. 19, 1997, now Pat. No. 5,968,456.

(60) Provisional application No. 60/046,027, filed on May 9, 1997.

(51) Int. Cl.
*F01N 3/00* (2006.01)

(52) U.S. Cl. .............................. 60/284; 60/292; 60/298; 60/299; 60/324; 136/205; 422/109; 422/110; 422/173; 422/174; 422/199; 422/202

(58) Field of Classification Search ................. 60/274, 60/284, 298, 299, 300, 320; 422/109, 110, 422/172–174, 176–177, 198–199, 202; 136/201, 136/205, 211–212; 292/298, 299, 300; 324/320
See application file for complete search history.

(56) References Cited

U.S. PATENT DOCUMENTS

| | | | | | |
|---|---|---|---|---|---|
| 3,217,696 | A | * | 11/1965 | Kiekhaefer | 123/2 |
| 3,835,645 | A | * | 9/1974 | Zoleta | 60/274 |
| 5,033,264 | A | * | 7/1991 | Cabral | 60/274 |
| 5,477,676 | A | * | 12/1995 | Benson et al. | 60/274 |
| 6,423,275 | B1 | * | 7/2002 | D'Souza | 422/129 |
| 6,675,573 | B2 | * | 1/2004 | Kempfer | 60/284 |

* cited by examiner

*Primary Examiner*—Tu M. Nguyen
(74) *Attorney, Agent, or Firm*—Alix, Yale & Ristas, LLP

(57) ABSTRACT

An automobile catalytic converter that utilizes the energy of the exothermic reactions that take place in the catalysis substrate to produce electrical energy with a thermoelectric generator. On vehicle cold start, the thermoelectric generator is used as a heat pump to heat the catalyst substrate to reduce the time to catalyst light-off. In this way, the catalytic converter comes up to operating temperature more rapidly, reducing the amount of pollutant emissions at vehicle start-up.

15 Claims, 12 Drawing Sheets

THERMOELECTRIC CATALYTIC POWER GENERATOR WITH PREHEAT

CROSS-REFERENCE TO RELATED APPLICATIONS

This application is a continuation-in-part of U.S. patent application No. 09/419,995 filed on Oct. 18, 1999, now abandoned which is a continuation of application Ser. No. 08/933,663, filed Sep. 19, 1997, now U.S. Pat. No. 5,968,456, which claims the benefit of U.S. Provisional Application Ser. No. 60/046,027 filed May 9, 1997.

BACKGROUND OF THE INVENTION

1. Field of the Invention

This invention relates to temperature control and power generation of a catalytic converter. More particularly this invention relates to combining the preheating of a catalytic converter and with converting the heat energy of the catalytic converter to electrical energy.

2. Prior Art

In an internal combustion engine vehicle, approximately 80% of the energy consumed leaves the vehicle as waste heat in various forms. For example, heat is emitted from the tailpipe, through the radiator, convected and radiated off the engine. Included with the waste heat out the tailpipe are the products of combustion which must meet strict emission standards. To meet these emission standards, the catalytic converter has been a most useful tool.

The allowable emission of pollutants from internal combustion engine vehicles has been dropping and will continue to decrease over the next five years. Some states, California for instance, have requirements that are more stringent than federal standards. Therefore the goal for the automotive industry is to meet these more stringent standards. The acceptable standards have gone from the transitional low emission vehicle (TLEV) of 0.125/3.4/0.4 g/mile of HC/CO/NOx, instituted in 1994, to the low emission vehicle (LEV) of 0.075/3.4/0.2 g/mile of HC/CO/NOx for 75% of the vehicles sold by 2003. Also by 2003, 15% of the vehicles sold must meet the requirements of the ultra-low emission vehicle (ULEV) of 0.040/1.7/0.2 g/mile of HC/CO/NOx. It is recognized that in a cold start of an internal combustion engine, 70–80% of the hydrocarbon and carbon monoxide pollutants that the vehicle emits occur in the first 100 seconds of operation during the Environmental Protection Agency's Federal Test Procedure (FTP). The FTP is the certification procedure that all vehicles must meet for hydrocarbon, carbon monoxide and nitrous oxide pollutants at the tailpipe. The highest emission of pollutants occurs prior to the catalytic converter reaching light-off temperature, that is, prior to the catalysis monolith becoming active. With early light-off of the catalyst at engine cold start, the internal combustion engine can meet the new pollution requirements.

The objective of reducing the amount of pollutants that exit the tailpipe on cold vehicle start-up must balance between having the exhaust gases that enter the catalytic converter hot enough to expedite the catalyst light-off temperature while at the same time not getting so hot that the catalyst is aged prematurely. Therefore, although insulation of the exhaust system will reduce light-off time, the consequence of reduced catalysis lifetime is an undesirable effect. Exceeding the high temperature limit of the catalyst monolith shortens the life of the catalytic converter.

The standard four-cycle internal combustion engine, whether the mode of operation is a spark-ignition or a diesel engine, operates as an air pump or compressor during part of the cycle. The air pump mode of operation is of interest to this invention during the exhaust stroke, when the engine piston forces the products of combustion out of the cylinder and into the exhaust manifold and exhaust piping. In this portion of the cycle, the engine is operating as an air pump.

There are many prior art concepts aimed at recovering energy from the tailpipe of an internal combustion engine. However, none of the prior art concepts has been applied within a catalytic converter. In the exhaust of an internal combustion engine, there are tremendous temperature differences between a vehicle operating on the highway and a vehicle operating in stop and go traffic on a busy city street. Within a catalytic converter, exothermic reactions take place to convert the pollutants of the combustion process to harmless by-products. The exothermic reactions occur at a relatively high, constant temperature.

During cold start of the internal combustion engine, the catalytic converter is not operating. This could be on a cold winter day when the temperature is −10° C. or on a summer day when the ambient temperature is 30° C. The catalytic converter must be heated to approximately 250° C. before it becomes operable to convert the combustion by-products of the internal combustion engine. Normal operating temperature is in the 400° C. to 800° C. range. For the internal combustion engine to meet the Federal Test Procedure for the new stringent exhaust requirements, the catalyst must come up to temperature as quickly as possible.

What is also needed is a device which would recover some of the waste energy that normally exit the vehicle through the tailpipe converted to electrical energy in the catalytic converter. This electrical energy would then be available to the electrical system of the vehicle to charge the battery or run any of the electrical components in the vehicle.

SUMMARY OF THE INVENTION

The above-discussed and other drawbacks and deficiencies of the prior art are overcome or alleviated by the Thermoelectric Catalytic Power Generator with Preheat.

By supplying the thermoelectric generator with electric power, the generator will be a heat pump and provide thermal energy to the catalytic converter to reduce its heat-up time. This electric power could be provided by an external source that is plugged in at night and set on a timer to heat the catalyst at a specific time. Or, the electric power can be supplied by the battery or the alternator on vehicle start-up, which would greatly reduce the heat-up time under normal operating conditions for the catalytic converter. The means of providing the electrical energy to the thermoelectric generator in the catalytic converter is not important. The fact that the thermoelectric generator can provide a dual service is important and an improvement in the state of the art as further described in this patent.

To aid the internal combustion engine vehicle in meeting the new pollution standards, included as part of the patent and the pollution control system of the catalytic converter with the thermoelectric generator is the ECO valve. The products of combustion from the internal combustion engine are a compressible fluid. Therefore, restricting the flow of the combustion gases for a short period of time while the catalytic converter is heating up will aid the vehicle in meeting the initial phase of the FTP test requirement when most of the pollutants are generated.

The inclusion of the ECO valve in the exhaust line of the internal combustion engine will increase the back pressure in the exhaust line, but for the short period of time that this occurs, the operation of the internal combustion engine will not be compromised. The four-stroke internal combustion engine on two of the strokes is a compressor. Therefore, one of these compression strokes will be utilized to reduce the amount of pollutants that leave the engine, at least for a short period of time.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several Figures.

DETAILED DESCRIPTION OF THE PREFERRED EMBODIMENT

The figures that follow will better describe the operation of the thermoelectric catalytic power generator with the inclusion of an economy, or ECO, valve to increase the overall efficiency of the internal combustion engine as well as reduce the amount of pollutants that the vehicle emits.

Figure 1:
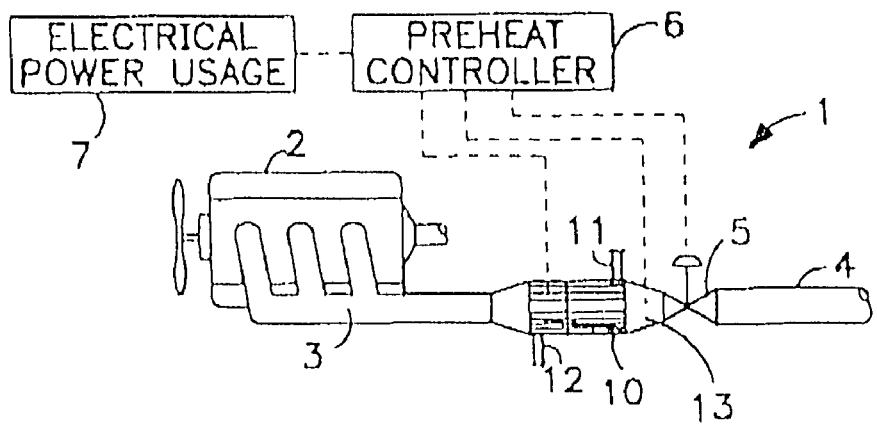
FIG. 1 is a schematic representation of an internal combustion engine incorporating the thermoelectric catalytic power generator of the present invention.

Referring to FIG. 1 there is shown a basic layout of an exhaust system of an internal combustion engine and schematic incorporating thermoelectric catalytic power generator system 1 of the present invention. The system includes internal combustion engine 2, exhaust pipe 3, intermediate pipe 4, ECO valve 5, preheat controller 6, electric load 7, and catalytic converter 10. Catalytic converter 10 includes a coolant inlet 11, a coolant outlet 12 and temperature sensor 13 disposed inside of catalytic converter. The preheat controller receives a signal from temperature sensor 13.

Figure 8:
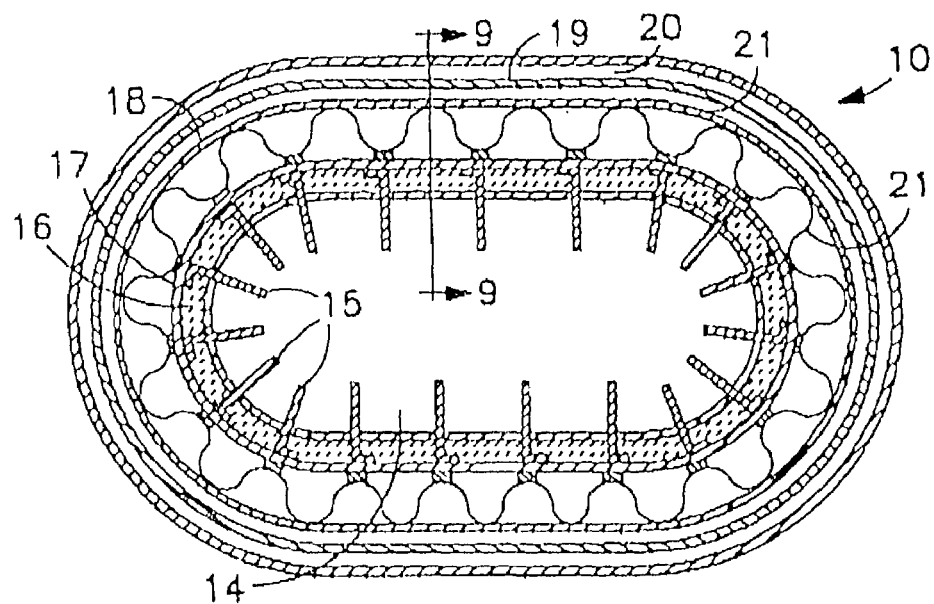
FIG. 8 is a cross sectional view of an embodiment of a catalytic converter incorporating the present invention.

Referring for the moment to FIG. 8 there is shown a cross sectional view of catalytic converter 10. For purposes of explanation, the catalytic converter includes catalytic monolith 14, heat transfer fins 15, and thermoelectric generators 30.

Referring back to FIG. 1, during operation of the thermoelectric catalytic power generator system when the temperature of the catalytic converter is below the light off temperature, such as exists during a cold start up condition, the preheat controller signals ECO valve 5 to restrict the flow of exhaust exiting the catalytic converter. The ECO valve restricts a portion of the exhaust, permitting enough exhaust to pass to allow the engine to run, thereby increasing the rate of heat build-up within the catalytic converter. The preheat controller also sends an electric current to the thermoelectric generators via wire 22 which also act to increase the rate of heat build-up within the catalytic converter. When the catalytic monolith material reaches the light off temperature the preheat controller opens the ECO valve and stops the current flow to the thermoelectric generators and the exhaust gases are treated within the catalytic converter to remove the pollutants and exit into the intermediate pipe in an unrestricted fashion.

Figure 2:
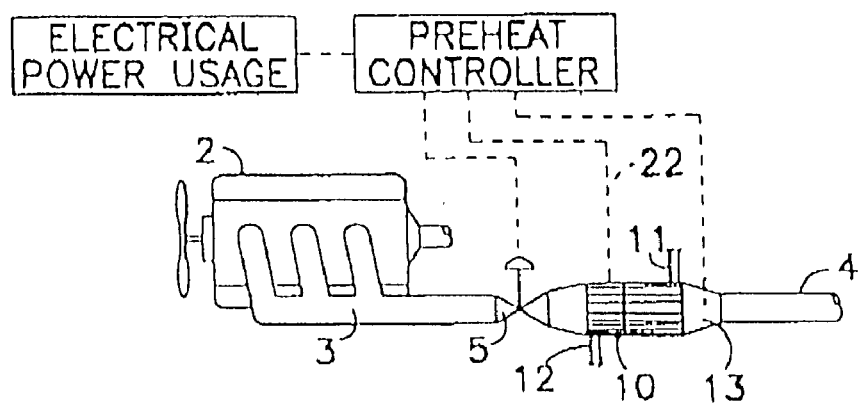
FIG. 2 is a schematic representation of an internal combustion engine incorporating the thermoelectric catalytic power generator of the present invention.

Shown in FIG. 2 is an alternative embodiment of the present invention incorporating the ECO valve in exhaust pipe 3 upstream of catalytic converter 10. In this embodiment the preheat controller operates the same as in the embodiment described herein above. The ECO valve is closed to restrict the exhaust of the engine, permitting enough exhaust gas to pass therethrough to allow the engine to operate, thereby increasing the rate of heat build-up within the engine components. The preheat controller sends electrical current to the thermoelectric generators to increase the rate at which heat is built up within the catalytic converter. Similar to the embodiment described above, the restriction allows a portion of the exhaust gases to exit the intermediate pipe and thereby limits the amount of pollution that can escape to the atmosphere prior to light off of the catalytic converter. During cold engine start conditions 70% to 80% of the pollutants that are measured during FTP certification occur in the first 100 seconds of engine operation. In a particular embodiment of the present invention, the exhaust flow is restricted for up to 40 seconds, the catalyst lights off, the ECO valve is opened the current to the thermoelectric generators is cut off and the exhaust gases exit the vehicle with the majority of the gases having been converted to harmless non-pollutant by-products by the catalytic converter.

Figure 3:
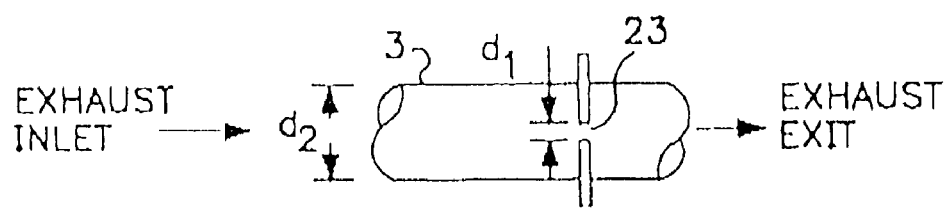
FIG. 3 is a schematic representation of an embodiment of the ECO valve of the present invention.

Shown in FIG. 3 is a schematic representation of the ECO valve represented by orifice 23. A shown orifice 23 has diameter $d_1$ and exhaust pipe has diameter $d_2$. In an operating example, consider a 3.3 liter engine operating at 800 rpm. With a diameter ratio of orifice diameter to pipe diameter of $d_1/d_{2=0.157}$, as shown in the figure, there will be choked flow of the products of combustion. That is, for a compressible fluid like the products of combustion, there is a maximum mass flowrate that the orifice can support for the given flow conditions. When the choked flow condition is reached, the velocity at the minimum diameter, orifice 23, reaches Mach 1 (the speed of sound). Then no matter how the flow conditions change, no more mass can flow through the orifice. The maximum mass flowrate is calculated in equation (1):

$$m_{MAX} = \rho_o \left[\frac{2}{k+1}\right]^1 - (k-1)A * \left[\frac{kR2T_o}{k+1}\right]^{\frac{0}{00}}$$

where $m_{Max}$=the mass flowrate
$\rho_o$=upstream density
k=specific heat ratio
A*=area of the small diameter
R=universal gas constant
$T_o$=upstream temperature.

In the example for the 3.3 liter engine operating at 800 rpm, the maximum mass flowrate through the orifice is 43.5% of the total flowrate. Therefore, if the ECO valve is closed for 40 seconds on vehicle start-up, the amount of pollutants that leave the vehicle is reduced by 56.5%. At the time when the catalyst in the catalytic converter reaches light-off temperature, the ECO valve is opened all the way to allow for normal operation. Note that under normal operating conditions the ECO valve is wide open.

It is recognized that some engines may have characteristics that make it easier to cold start with the ECO valve in the open position. In an embodiment of the present invention it is contemplated that the ECO valve begins in the wide open position when the engine is started from a cold start, and then closed as the engine begins to run running normally. Once the engine has started, the ECO valve is closed to prevent the effluent of pollutants from the tailpipe of the vehicle.

Figure 4:
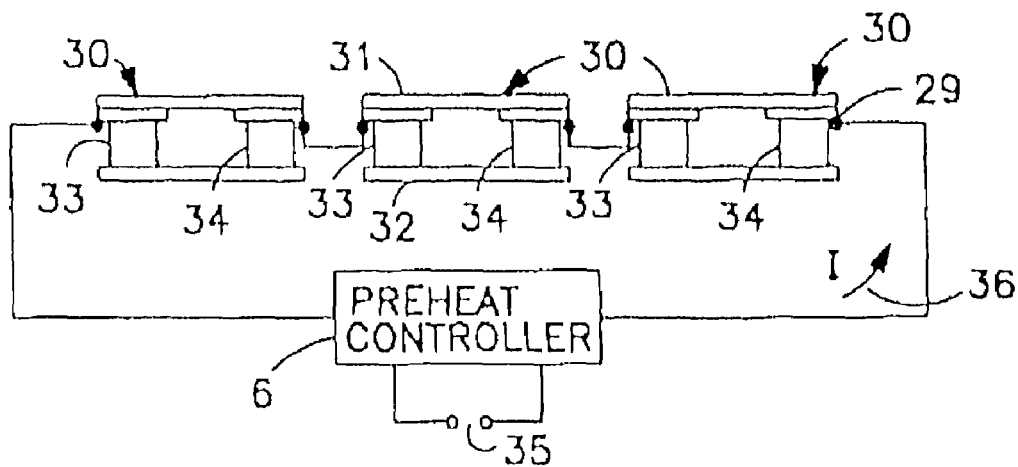
FIG. 4 is a schematic representation of a control circuit for the thermoelectric generators of the present invention.

Referring to FIG. 4 there is shown a schematic of thermoelectric generators 30. The thermoelectric generators include hot junction 31, cold junction 32, p-type semiconductor material 33 and n-type semiconductor material 34 and electrical junctions 29. Preheat controller 6 receives current from power source 35. In an embodiment power source 35 is an alternator mounted to the internal combustion engine and electrically connected to the preheat controller. The controller delivers current 36 in the direction shown to the p-type and n-type materials at electrical junctions 29. With the current flowing as shown the heat is transferred to the hot junction to increase the rate of heat build-up of the catalytic material. In one embodiment the preheat controller continues to supply current to the thermoelectric generators until the light off temperature is reached as determined by the temperature sensor. The temperature sensor could be a thermocouple or thermistor. In another embodiment the preheat controller senses the amount of current that has been supplied to the thermoelectric generators and compares it to a predetermined amount of current. Once the predetermined amount of current has been supplied, the preheat controller interrupts the flow of current to the thermoelectric generators. When no current is supplied to the thermoelectric generators, as in the time period prior to a cold start, cold junction 32 may be higher in temperature than hot junction 31. In this situation the thermoelectric generator produces a current that is sensed by preheat controller 6 and the preheat controller supplies current to the thermoelectric generators to increase the rate of heat build up in the catalytic converter. In a situation, prior to cold start, where the hot junction is at a higher temperature than the cold junction the current produced by the thermoelectric generator is opposite in direction. When a predetermined level of current output from the thermoelectric generator is sensed by the controller, then no preheat of the catalytic converter is necessary.

After light-off temperature is achieved the preheat controller interrupts current flow from the power source to the thermoelectric generators. With reference to FIGS. 8 and 9, after light-off the heat transfer mode is changed. Hot catalytic monolith 14 transfers heat to thermoelectric generators 30 via heat transfer fins 15. In this mode of operation the thermoelectric generators produce electrical energy that is transferred to the preheat controller.

Figure 5:
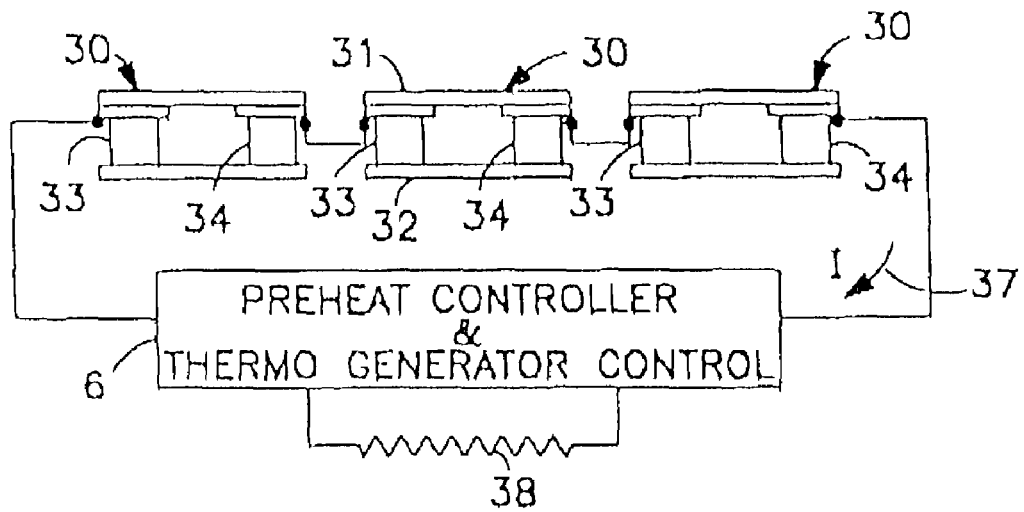
FIG. 5 is a schematic representation of a control circuit for the thermoelectric generators of the present invention.

Referring to FIG. 5, there is shown a schematic of thermoelectric generators in a electrical producing mode of the present invention. The heat transferred to hot junction 31 produces a temperature difference between the hot junction and cold junction 32. The temperature difference produce an electrical potential in the p-type and n-type materials. Current output 37, which is shown opposite in direction to that of current 36, is directed to preheat controller 6. The preheat controller transfers the power to load 38. In an embodiment of the present invention load 38 is the battery of a vehicle. The p-n junctions can be wired in series and/or parallel depending on the voltage and current that are needed on the vehicle.

Figure 6:
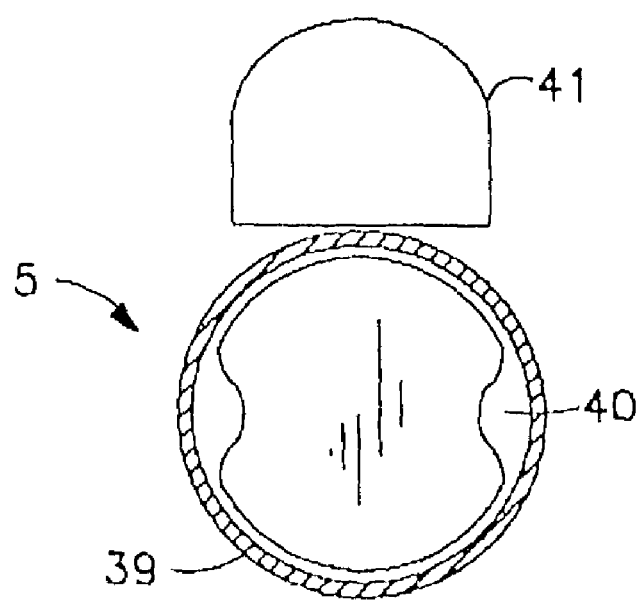
FIG. 6 is a cross sectional view of an embodiment of the ECO valve of the present invention.
Figure 7:
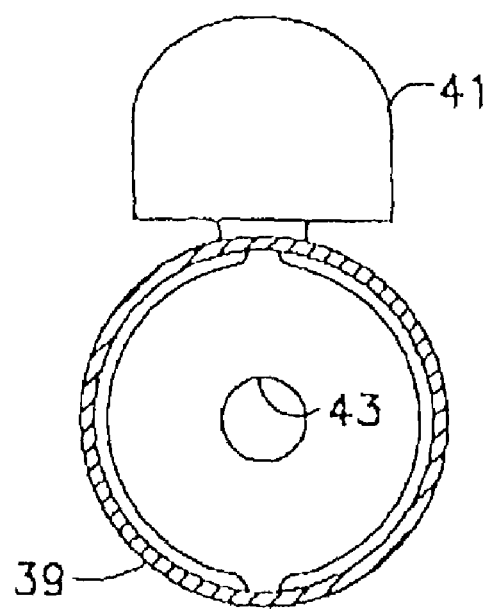
FIG. 7 is a cross sectional view of another embodiment of the ECO valve of the present invention.

FIGS. 6 and 7 illustrate two alternative embodiments of the ECO valve. ECO valve 5 shown in FIG. 6 includes butterfly valve 39 having by-pass opening 40 and valve actuator 41. The by-pass opening is sized such that the minimum orifice relationships disclosed herein above is satisfied. The valve actuator is controlled by the preheat controller or in an alternative embodiment the valve actuator is a self contained automatic device adapted to open the valve wide open after the predetermined amount of time has elapsed.

The alternative embodiment shown in FIG. 7 includes bypass opening 43 in the center of butterfly valve 39. The operation of this embodiment is similar to that described herein above. This embodiment could advantageously be comprised of a ball valve having bypass opening disposed in the center thereof.

Note that for either valve configuration, if the vehicle starts to accelerate and more exhaust must be emitted from the tailpipe to improve the driveability of the vehicle, the valve could be throttled to an opening that would accommodate the increased speed, and at the same time still reduce the amount of pollutants that exit the vehicle.

The valves that are shown in FIGS. 6 and 7 allow a small portion of exhaust gas to pass through the valve even when the valve is completely closed. By functioning in this manner if the valve malfunctions in the closed position the vehicle will still be operable. It is contemplated certain embodiments could be designed with no through holes on full valve closure. In this control scheme, the by-pass of the exhaust would be controlled by throttling the valve. However, with this method of operation, if the valve failed in the closed position, the vehicle would not operate. In this embodiment, for better control of the valve, a flowrate measurement with feedback control would enhance the overall operation of the control system.

Figure 10:
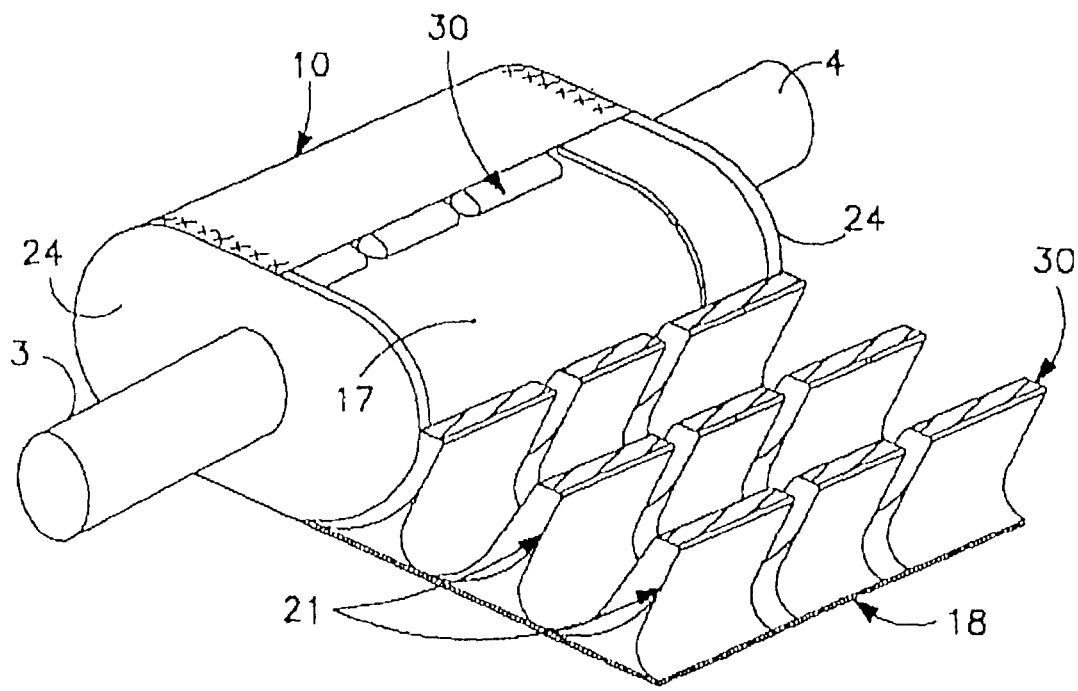
FIG. 10 is an isometric representation of a catalytic converter incorporating the present invention.

The characteristics of the thermoelectric generators in high temperature applications such as the environment in a catalytic converter are such that the best way to mount the generator and maintain good thermal contact is a compression method. This allows thermal expansion of the generator to take place without damage. FIG. 10 shows the partial assembly of thermoelectric generators 30 in catalytic converter 10. The thermoelectric generators are mounted to compression springs 21. The compression springs are mounted on spring support shell 18 which is in turn welded to end plates 24. The nine compression springs on the right side of the figure have not yet been compressed while the three on the left hand side of the figure have already been compressed into place inside of the catalytic converter. The thermoelectric generators are held in heat transfer relationship with compression shell 17 when the compression springs are biased between the spring support shell and the thermoelectric generators. The compression springs ensure contact of the thermoelectric generators with the compression shell despite differences in thermal expansion rates of components of the catalytic converter as well as maintaining contact during vibratory movement of the catalytic converter as installed in a vehicle.

FIG. 8 shows a cross-sectional assembled view of the catalytic converter incorporating the thermoelectric power generating system of the present invention. The catalytic converter includes catalytic monolith 14, heat transfer fins 15, high temperature insulation 16, compression shell 17, spring support shell 18, insulation shell 19, coolant passage 20, and compression springs 21. The catalytic monolith has heat transfer fins extended down into it from the surface of the compression shell. These fins improve the heat transfer between the catalyst bed and the thermoelectric generators which are in direct contact with the compression shell. In this way, they can add heat to the monolith during cold engine start and then transfer heat to the hot junction of the thermoelectric generator when the catalyst lights off.

Referring again to FIG. 8 there is illustrated insulation shell 19 and coolant jacket 20. Referring back to FIG. 1 coolant enters the catalytic converter through coolant inlet 11 and exits through coolant outlet 12. In one embodiment the coolant is engine coolant supplied by a water pump mounted to the engine. Alternative embodiments include a separate coolant system. The coolant circulates inside of the coolant jacket to maintain the cold junctions of thermoelectric generators at a temperature that is relatively cooler than the hot junctions. Insulation shell 19 insulates the coolant from the high temperatures that exist in the catalytic converter. A high rate of heat transfer from catalytic monolith 14 to the hot junctions takes place via heat transfer fins 15. In addition the coolant jacket works to preclude premature catalytic aging. FIG. 9 shows the orientation of several of the compression spring assemblies along the axis of the catalytic converter.

Figure 9A:
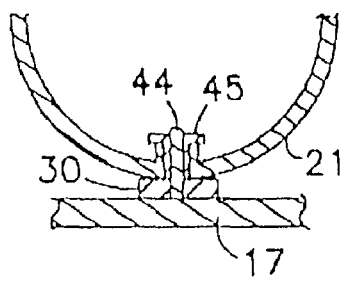
FIG. 9A is a section view taken substantially along line 9A—9A in FIG. 9 of an embodiment of the thermoelectric generators of the present invention.
Figure 9:
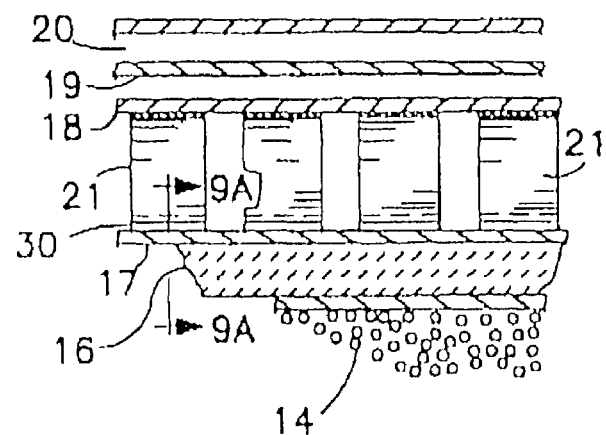
FIG. 9 is a section view taken substantially along line 9—9 in FIG. 8 of an embodiment of the thermoelectric generators of the present invention.

Referring to FIG. 9A there is shown electrical contact 44 of the thermoelectric generator 30. The electrical contact is bonded to electrical junction 29 of the thermoelectric generator. The electrical contact is assembled within ceramic insulating bushing 45 inside of the compression spring. In one embodiment of the present invention electrical contact 44 is the positive junction of the thermoelectric generator, and the compression shell is the negative junction of the thermoelectric generator.

Figure 11:
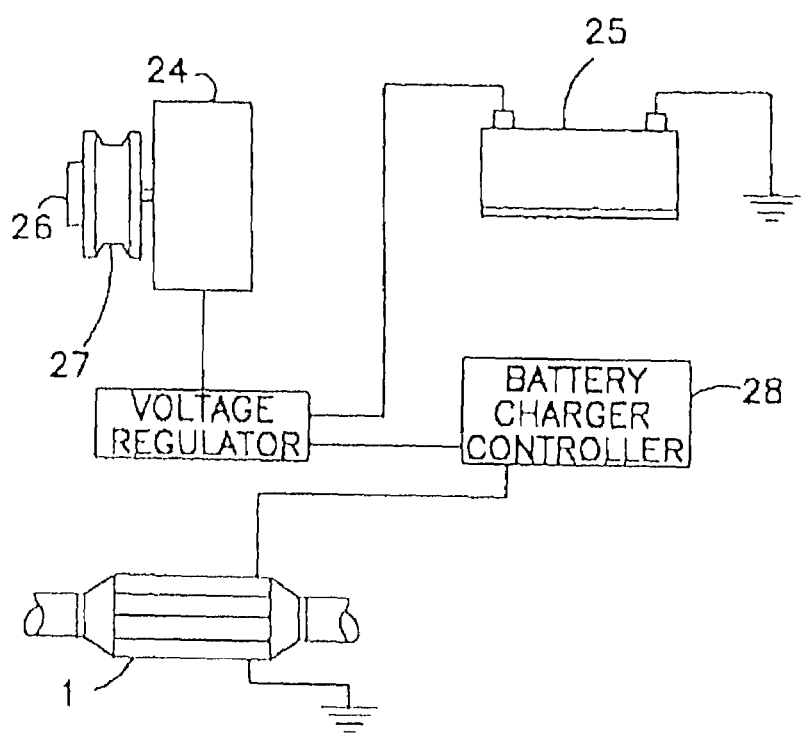
FIG. 11 is a schematic representation of an embodiment of the electrical generator of the present invention.

FIG. 11 illustrates an embodiment having an interdependence between the thermoelectric catalytic power generator 10 and alternator 24 of the vehicle when charging of battery 25 is necessary. The alternator of the vehicle includes magnetically operated clutch 26 on drive pulley 27. The clutch is disengaged if the thermoelectric catalytic power generator is producing enough electrical power to maintain the charge in the battery, and the alternator pulley would be free-wheeling. When battery charger controller 28 detects a shortfall in the current output of the catalytic power generator, the magnetic clutch on the alternator will be engaged, and the alternator charges the battery as needed.

The figures of the thermoelectric generator in the catalytic converter contained herein show the basic p-material and n-material junctions that are used for the device. However, the state of the art is such that variations of the basic p-n junctions can include cascading or staging of the generators to improve the efficiency and the effectiveness of the thermal energy that is available are also contemplated by this invention. This would also include staging the p-material and the n-material to improve the overall figure of merit.

Figure 12:
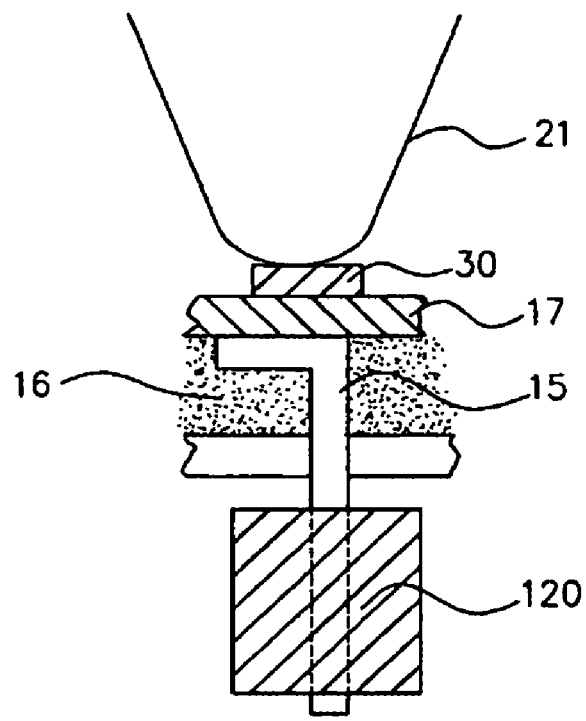
FIG. 12 is a fragmentary sectional view, partly in schematic, of a quick-light catalyst which is attached to a heat transfer fin.

FIG. 12 illustrates one of the heat transfer fins 15 that is in thermal communication with the catalysis substrate and the exhaust gases in the catalytic converter. This fin 15 has been modified to include a quick-light catalyst 120. This quick-light catalyst provides two advantages to the present application. (i) When the automobile starts up from the cold-start condition, electrical energy can be provided to the TEG module, causing the module to function as a heat pump. This will add heat to the quick-light catalyst, causing it to heat up faster and start the process of treating the exhaust gases more quickly. Once a small portion of the catalyst lights off, the high energy flux from the catalytic reaction quickly heats the rest of the catalyst, causing a fully functional catalytic converter. (ii.) Since the quick-light catalyst is in good thermal contact with the heat transfer fin that provides thermal communication between the catalysis bed and the TEG modules, the sooner the catalyst lights off, the sooner the TEGs can start producing electric power for the vehicle. Therefore, this heat transfer augmentation design with the quick-light catalyst provides two very distinct advantages over the prior art.

Figure 13:
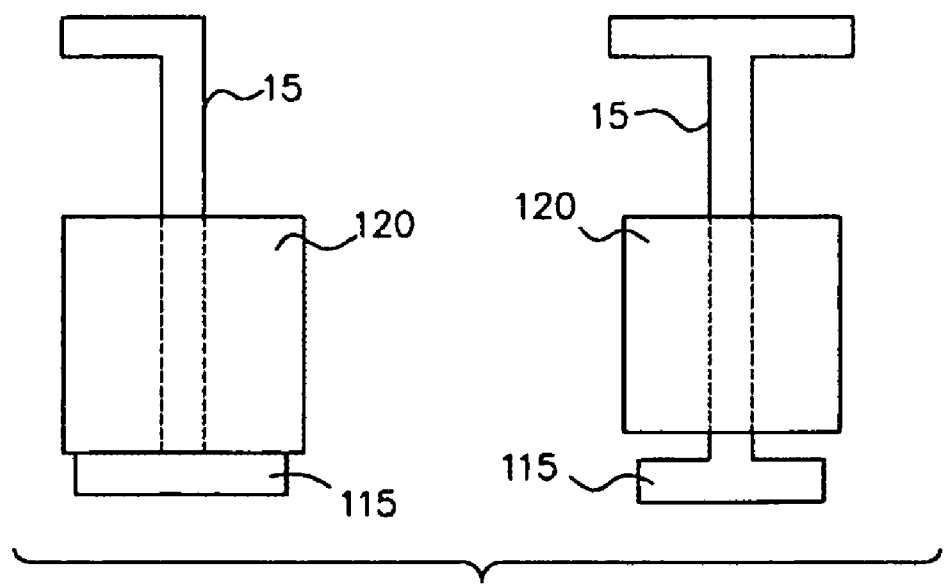
FIG. 13 is a fragmentary sectional view, partly in schematic, illustrating an alternate fin design with a quick-light catalyst in accordance with the present invention.

FIG. 13 illustrates a slight modification to the existing heat transfer fin. A "hanger" 115 is provided as part of the design to allow more heat transfer contact with the catalyst bed and to supply a better means of support for the catalyst 120 onto the fin. This is especially helpful for diverse coefficients of thermal expansion between metals that make good thermal conductors (fins) and the catalyst being bonded or supported by it.

Although various TEG module materials are available that will function in the catalytic converter as well as more being developed, particular materials in use today are especially common. For example, bismuth telluride is very common. However, the temperature range in a catalytic converter may be too great unless precautions are taken. The following figures will demonstrate that this can be overcome by the thermal design taught in this application.

Figure 14:
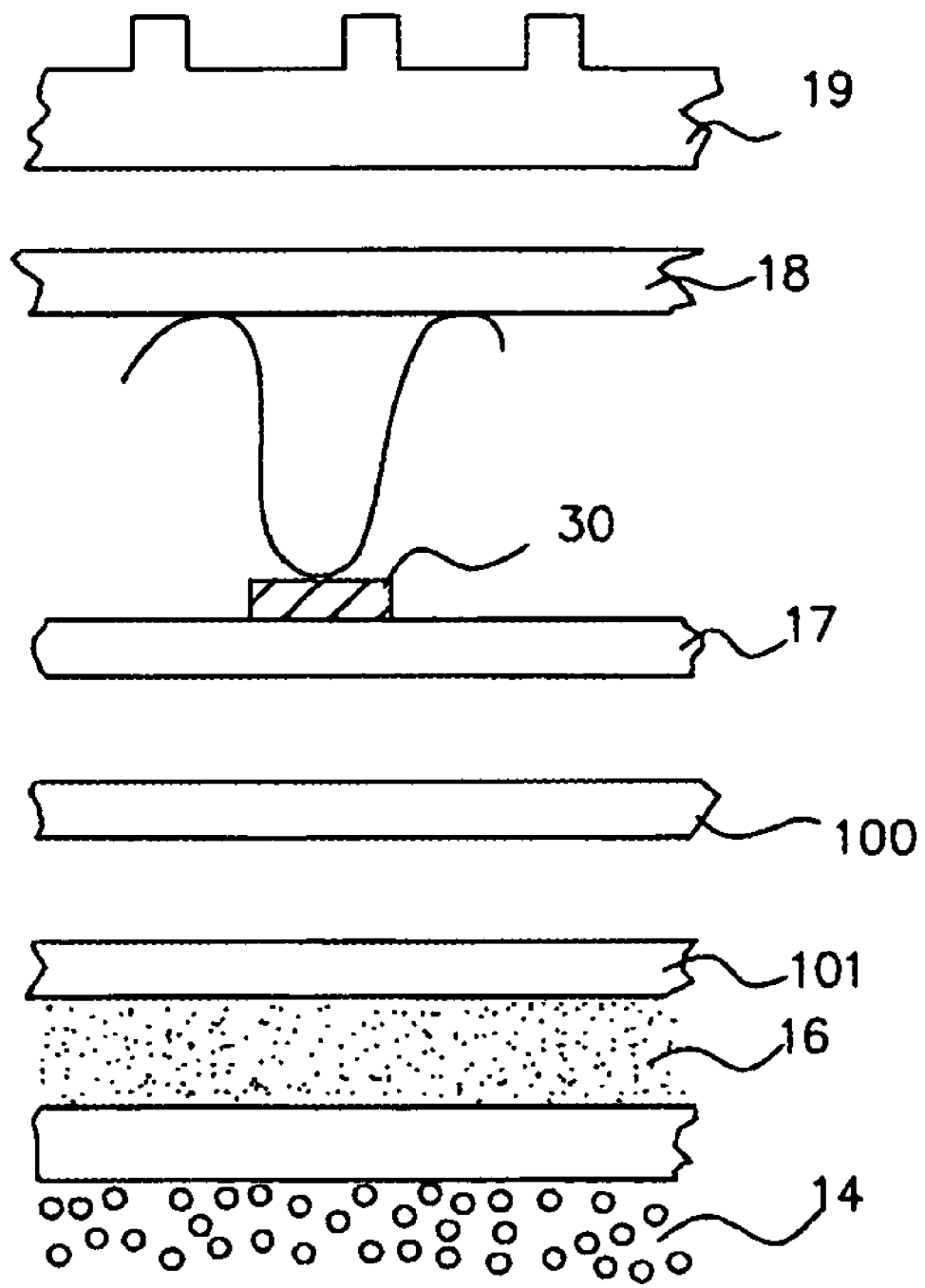
FIG. 14 is a fragmentary sectional view, partly in schematic, illustrating a heat transfer fin and an associated assembly illustrating no heat transfer into the catalyst substrate.

FIG. 14 shows a radiation shield 100 positioned between the high temperature insulation 16 and the spring compression shell 17. A second shell 101 must be added to encase the insulation 16. Although this configuration prevents using the TEG module as a preheater for the catalyst, this allows the use of lower temperature operating TEG materials in the catalytic converter. In fact, more than one radiation shield can be used to better moderate the temperature difference between the catalysis substrate and the temperature that the TEG module will see. FIG. 14 also illustrates heat transfer augmentation on shell 19 in the water jacket.

Figure 15:
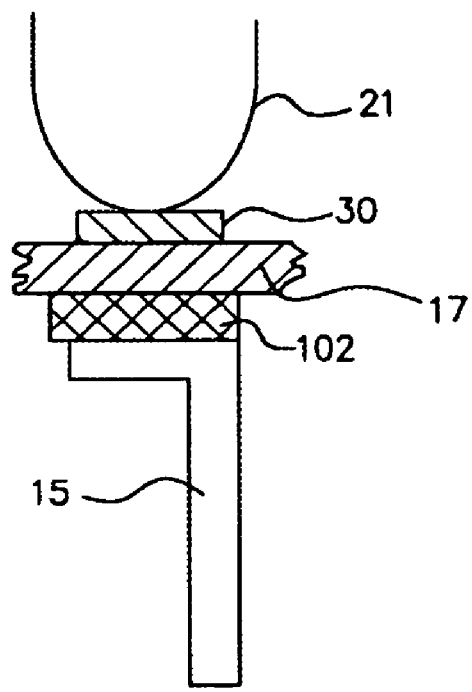
FIG. 15 is a fragmentary sectional view, partly in schematic, illustrating a mechanical insulation employed to control a hot junction temperature.

FIG. 15 illustrates a second means of moderating the temperature that the TEG module will experience. Mechanical insulation 102 between the heat transfer fin 15 and the TEG module support shell 17 will reduce the temperature of the module.

Figure 16:
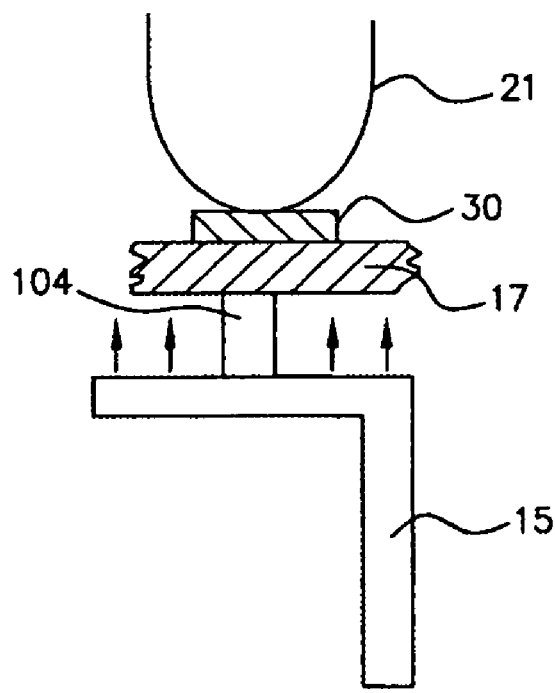
FIG. 16 is a fragmentary sectional view, partly in schematic, of a conduction fin for heating a hot junction of a thermoelectric generator.

FIG. 16 illustrates a variation and/or combination of the heat transfer techniques used in FIGS. 14 and 15. A thin fin 104 allows conduction heat transfer between the catalysis bed fin 15 and the TEG module support shell 17. This allows reasonably good thermal communication between the catalysis bed and the TEG module for preheating during cold start. The catalysis bed fin 15 also has a large surface area (shown as a primary radiation area) so that the primary mode of heat transfer will be radiation when the system is at operating temperature. Therefore, the TEG module is once again protected from extreme high temperatures that take place in the catalysis bed.

Figure 17:
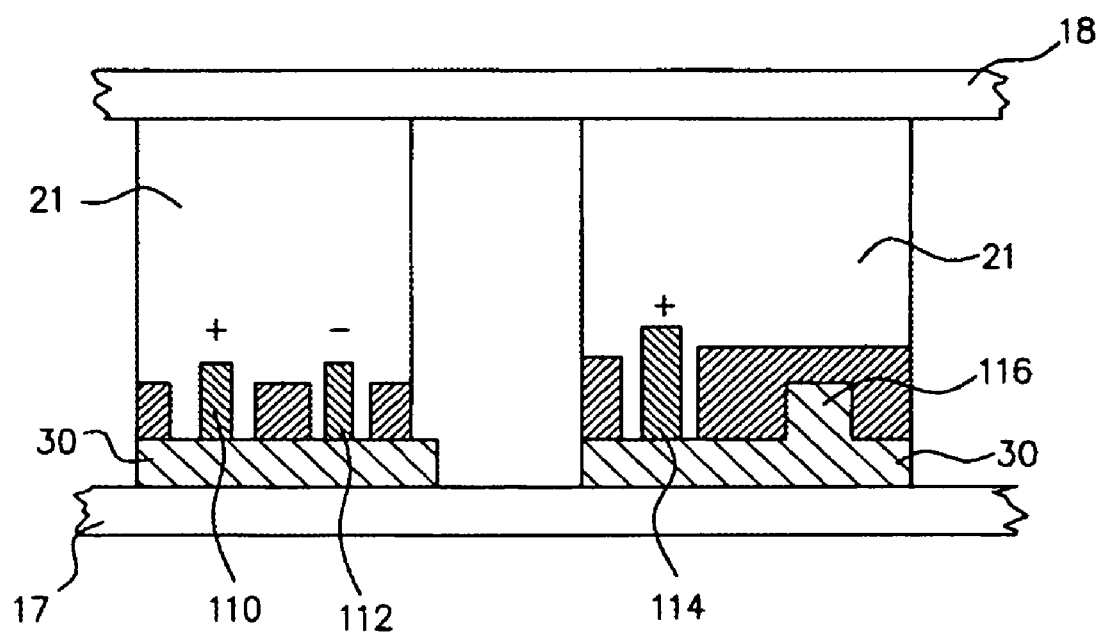
FIG. 17 is a sectional view, partly in schematic, of an embodiment of a thermoelectric generator in accordance with the present invention, further illustrating electrical lead connections.

FIG. 17 illustrates a modification of FIG. 9. This figure now shows the electrical leads of the TEG module used to keep the module in place under the spring and to prevent the module from rotating out of place. The spring/module assembly shown on the left has positive-negative electrical connections 110, 112. The spring/module assembly shown on the right has a positive lead connection 114 with a negative ground 116, which may or may not be more desirable for an automotive application, depending on how well the catalytic converter is grounded; or grounding may be desirable for the entire unit.

Figure 18:
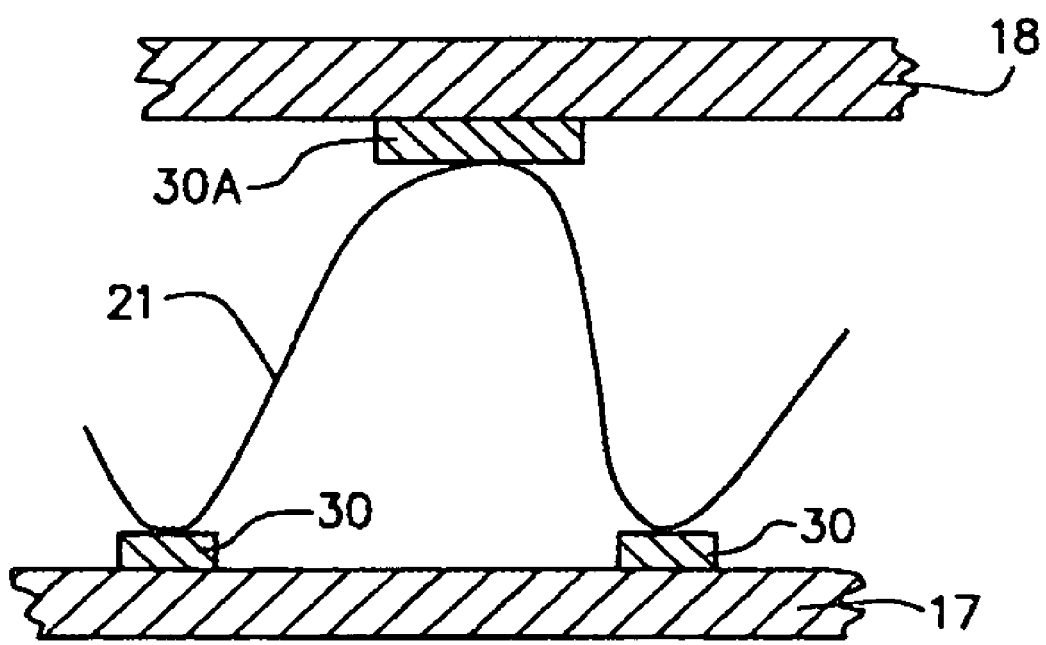
FIG. 18 is a fragmentary sectional view, partly in schematic, illustrating a hot and cold junction of a thermoelectric generator module.

FIG. 18 shows two different TEG modules with different temperature operating ranges. TEG module 30 is in the same location as the previously described module. Now TEG module 30A has been added for two reasons:
(a) this doubles the number of modules in the catalytic converter, hence increasing the electrical power output of the unit; and (b) the two module locations will experience different maximum temperatures—hence modules and material selection can better match the expected temperature range. Note that the orientation of the TEG modules is for the hot junction of module 30 to be in contact with shell 17 and the cold junction with the spring 21; and for module 30A, the hot junction is in contact with the spring 21 and the cold junction in contact with the shell 18.

Figure 19:
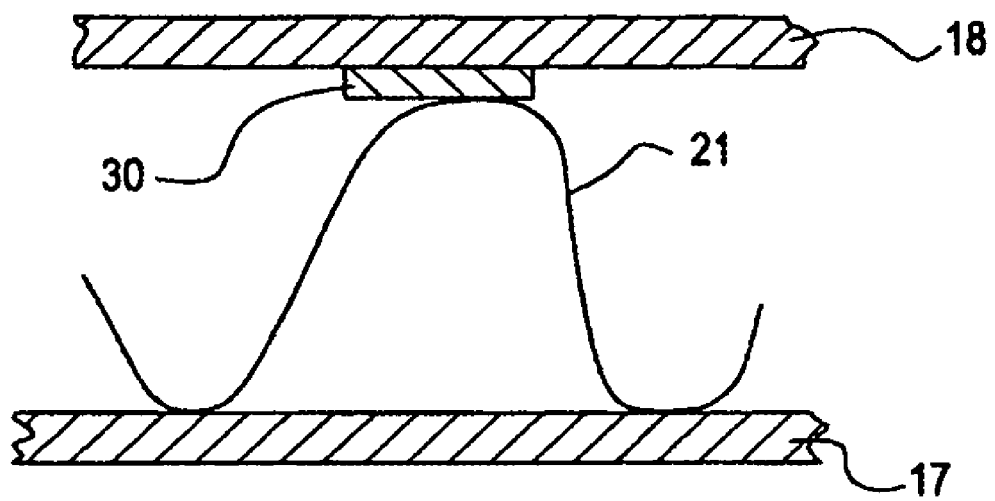
FIG. 19 is a fragmentary sectional view, partly in schematic, illustrating a modified embodiment of the assembly of FIG. 18.

FIG. 19 illustrates a slight modification to FIG. 18 where TEG module 30 is now in contact with the compression spring at a cooler location in the catalytic converter unit. Again this can be utilized to reduce the maximum temperature that the TEG module will experience. Now thermal conduction through the spring 21 is the primary mode of transferring heat to the TEG module from the catalysis bed, with or without the heat transfer fin 15.

Alternatively, the TEGs could be mounted at the other end of the springs as shown in FIG. 19, and the spring conducts heat to the hot junction of the TEG. The cold junction could be in full contact with the spring support shell 18 and facing fully the radiation shield 19 which will be at the temperature of the coolant, or the cold junction can be in full contact with the coolant without the benefit of radiation shield 19. In either case, the coolant will never see extreme hot temperatures that occur in the catalytic converter while at the same time maintaining the cold junction of TEGs at a constant cool temperature.

Figure 20:
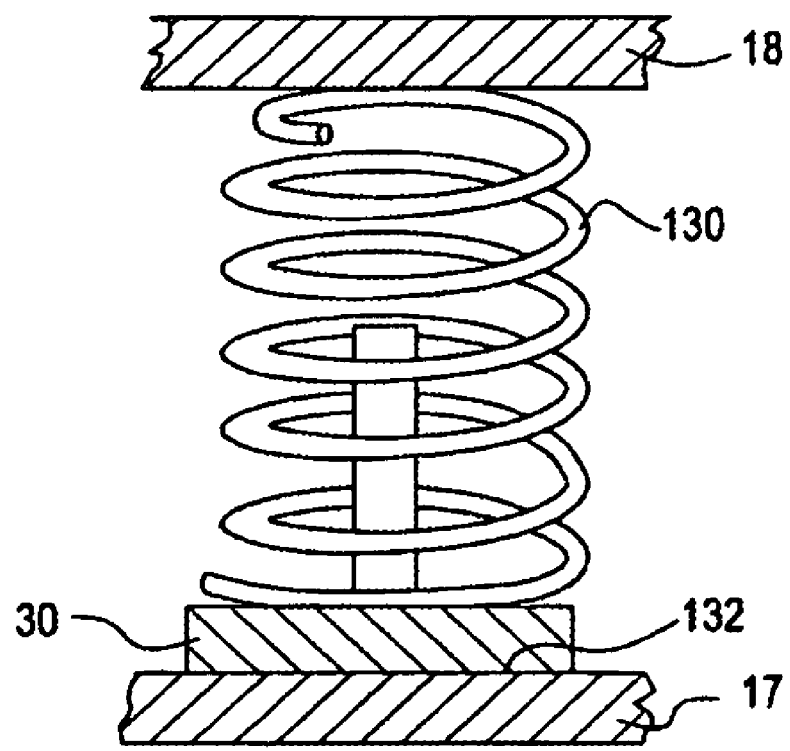
FIG. 20 is a sectional view, partly in schematic, of another embodiment of a thermoelectric generator in accordance with the present invention.

FIG. 20 is a modification of FIG. 9A with a different type of spring 130 used to compress the TEG module into thermal contact with the compression shell 17. Although this technique is not as amenable to high volume, mass production typically used in the automotive industry as the technique shown in FIG. 10, this design provides a means for exerting a positive pressure on the TEG module to maintain good thermal contact with the compression shell 17. In fact, most of the mass production attributes taught in FIG. 10 can be combined with the spring design shown in FIG. 20. Therefore, this type of compression spring assembly can be used as well.

FIG. 20 also shows how the negative ground 132 can be used with the TEG module—electrical contact is maintained with the compression shell 17. That is, in this mode of operation for the TEG module, the compression shell would have to be well grounded to the body chassis in order for proper electrical contact to be maintained.

Figure 21:
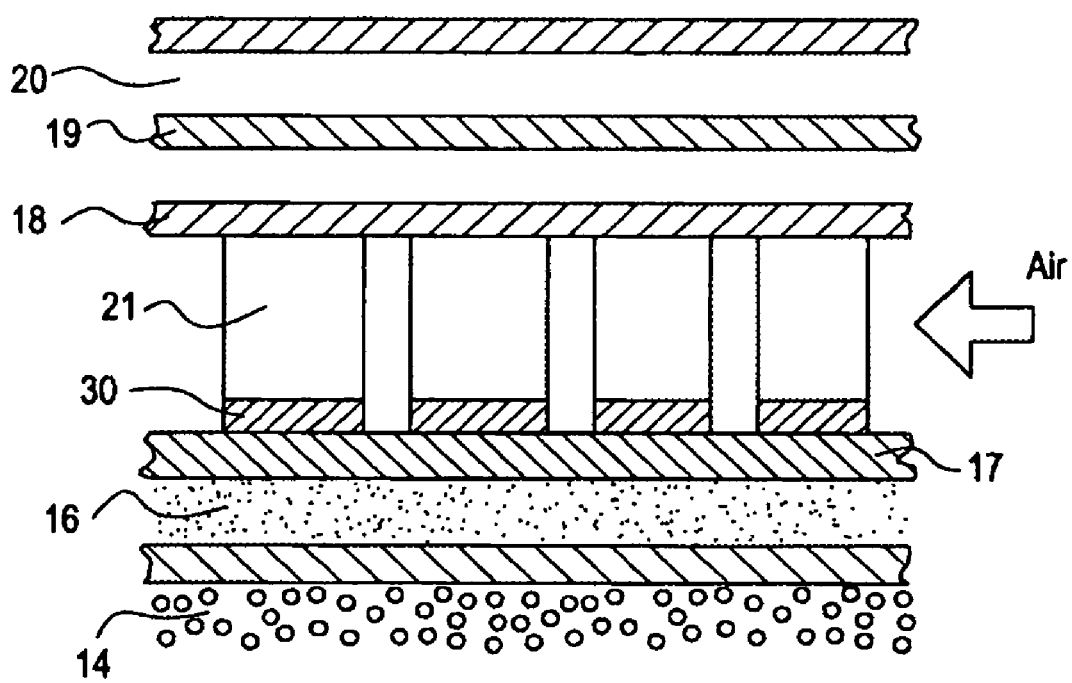
FIG. 21 is a sectional view, partly in schematic, illustrating additional features of the present invention.

FIG. 21 illustrates a means to maintain better temperature control in the region occupied by the TEG modules by allowing air to flow in the spring region between shell 17 and shell 18. In this way, the overall operating temperature of the modules can be reduced. Also, the cold junction temperature of the module can be reduced, improving electrical energy output. Combining the air cooling technique in the spring region of FIG. 21 with the mounting of the TEG module shown in FIG. 19 can provide another means for reducing the overall operating temperature of the TEG modules. This provides a better way to control the operating temperature of the modules, allowing for the module to operate in an environment that is more amenable to consistent, reliable power output over a long period of time. For a control scheme of this type, temperature sensor and a controller (not illustrated) would be required. However, the advantage of maintaining a well controlled temperature difference across the modules and the subsequent optimized performance of the module are well worth the extra cost and hardware.

The use of a radiation shield (similar to insulation shell 19) is an effective means to augment the heat transfer between the hot catalysis bed and the TEG module. The location of the shield as shown in the present invention does not preclude the use of a second shield or several shields on either the cold side junctions of the TEGs or on the hot side junctions.

The high temperatures that occur in the catalytic substrate may not be conductive to certain semiconductor materials. As discussed earlier, to enable a broader range of materials to be used in the catalytic converter, a radiation shield can be utilized between the compression shell 17 and the high temperature insulation that is in contact with the catalysis substrate. The radiation shield mounted on the hot side of the TEGs between the hot catalysis bed or the high temperature insulation spring support shell 18 (catalyst bed) and the hot junction of the TEGs maintains a uniform temperature at the not junction for improved system performance.

The Figures and embodiments disclosed are meant as examples only and do not attempt to define the scope of the invention presented herein. Those familiar with the art of manufacturing thermoelectric generators are well aware of the many aspects of these solid state devices that are not detailed on the Figures. However, the simplicity of the drawings has been utilized to emphasize the salient points of the invention and in no way should be construed as a limit to the scope, nature or spirit of the present invention.

As is well known in the art there are many materials suitable for comprising the p-type and n-type material of the thermoelectric generators. For example, SiGe, PbTe and PbSnTe as well as other semiconductor materials are available for usage as the thermoelectric generator. Protection from the heat generated within the catalytic converter as well as thermal and electrical efficiency are the main considerations for materials utilized in the present invention.

What is claimed is:

1. A preheat system for reducing emissions in a vehicle having an internal combustion engine, the preheat system comprising:
   an exhaust passage having exhaust gasses flowing herein and having a flow direction;
   a temperature sensor disposed in the catalytic converter adapted for determining a perceived temperature of the catalytic converter and further adapted for sending a signal corresponding to the perceived temperature;
   a catalytic converter including a catalytic monolith and having a light-off temperature and disposed in the exhaust passage and in fluid communication with the exhaust gases;
   a valve disposed in the exhaust passage either upstream or downstream of the catalytic converter, the valve having a closed position adapted for restricting the flow of exhaust gases and an open position; and
   a thermoelectric generator disposed in heat exchange relationship with the catalytic monolith;
   a preheat controller adapted for receiving the perceived temperature and comparing it with the light-off temperature and adapted for controlling the thermoelectric generator to transfer heat to the catalytic monolith, the preheat controller in electric communication with the valve and operable to position the valve in the closed position when the perceived temperature of the catalytic converter is below the light-off temperature and operable to position the valve in the open position when the perceived temperature of the catalytic converter is at or above the light-off temperature.

2. The preheat system as set forth in claim 1 wherein the valve comprises:
   a butterfly plate having at least one by-pass orifice disposed therein;
   the butterfly plate disposed within and substantially filling a cross sectional area of the exhaust gas passage in the closed position restricting the exhaust gas flow to the at least one by-pass orifice.

3. The preheat system as set forth in claim 1 wherein the valve comprises:
   a ball having at least one by-pass orifice disposed therein;
   the ball disposed within and substantially filling a cross sectional area of the exhaust gas passage in the closed position restricting the exhaust gas flow to the at least one by-pass orifice.

4. The preheat system as set forth in claim 1 wherein the catalytic converter has an upstream end and a downstream end and the valve is disposed in the exhaust passage proximate to the downstream end of the catalytic converter.

5. The preheat system as set forth in claim 1 wherein the catalytic converter has an upstream end and a downstream end and the valve is disposed in the exhaust passage proximate to the upstream end of the catalytic converter.

6. The preheat system as set forth in claim 1 wherein the system further comprises:
   the catalytic monolith disposed within a casing;
   a layer comprised of high temperature insulation disposed around the casing;
   a compression shell encased around the layer;
   a plurality of fins arranged about the casing and in heat exchange relationship with the catalytic monolith and the compression shell;
   a spring support shell mounted concentrically between the compression shell and the coolant jacket such that a gap is formed therebetween; and
   the thermoelectric generator fixedly mounted to a spring disposed within the gap such that a spring biases the thermoelectric generator against the compression shell in heat exchange relationship with fins.

7. The preheat system as set forth in claim 1 wherein the system further comprises:
   the catalytic monolith disposed within a casing;
   a layer comprised of high temperature insulation disposed around the casing;
   a compression shell encased around the layer;
   a plurality of fins arranged about the casing and in heat exchange relationship with the catalytic monolith and the compression shell;
   a spring support shell mounted concentrically between the compression shell and the coolant jacket such that a gap is formed therebetween;
   a spring disposed within the gap producing a biasing force between the compression shell and the spring support shell;
   the thermoelectric generators fixedly mounted to the spring disposed between the spring and the compression shell such that the spring biases the thermoelectric generators against the compression shell in heat exchange relationship with fins.

8. A preheat system for reducing emissions in a vehicle having an internal combustion engine, a fluid cooling system, an electrical power source, and an electrical load, the preheat system comprising:
   an exhaust passage having exhaust gases flowing therein having a flow direction;
   a catalytic converter having a light-off temperature, the catalytic converter disposed in the exhaust passage and in fluid communication with the exhaust gases and having a coolant inlet and a coolant outlet in fluid communication with the cooling system and a catalytic monolith;
   a coolant jacket disposed in an outer portion of the catalytic converter and in fluid communication with the coolant inlet and the coolant outlet to maintain the outer portion of the catalytic converter at a predetermined level;
   a plurality of thermoelectric generators disposed in heat exchange relationship with the catalytic monolith;
   a temperature sensor disposed in the catalytic converter adapted for determining a perceived temperature of the catalytic converter and further adapted for sending a signal corresponding to the perceived temperature;
   a preheat controller adapted for receiving the signal and comparing the perceived temperature with the light-off temperature;
   the preheat controller in electric communication with the electrical power source and the thermoelectric generators and operable to control the thermoelectric generators such that heat is transferred from the thermoelectric generators to the catalytic monolith when the perceived temperature is less than the light-off temperature; and the preheat controller further adapted for extracting electrical energy from the thermoelectric generators when the perceived temperature is greater than the light-off temperature so that heat is transferred from the catalytic monolith to the thermoelectric generators.

9. The preheat system as set forth in claim 8 wherein the catalytic converter further comprises:

the catalytic monolith disposed within a casing;

a layer comprised of high temperature insulation disposed around the casing;

a compression shell disposed around the layer;

a plurality of fins arranged about the casing and in heat exchange relationship with the catalytic monolith and the compression shell;

a spring support shell mounted concentrically between the compression shell and the coolant jacket such that a gap is formed therebetween; and the thermoelectric generators fixedly mounted to a plurality of springs disposed within the gap such that the springs bias the thermoelectric generators against the compression shell in heat exchange relationship with fins.

10. The preheat system as set forth in claim 8 wherein the catalytic converter further comprises:

the catalytic monolith disposed within a casing;

a layer comprised of high temperature insulation disposed around the casing;

a compression shell disposed around the layer;

a plurality of fins arranged about the casing and in heat exchange relationship with the catalytic monolith and the compression shell;

a spring support shell mounted concentrically between the compression shell and the coolant jacket such that a gap is formed therebetween;

a spring disposed with the gap producing a biasing force between the compression shell and the spring support shell; and the thermoelectric generators fixedly mounted to the spring disposed between the spring and the compression shell such that the spring biases the thermoelectric generators against the compression shell in heat exchange relationship with fins.

11. A catalytic converter system for producing electricity in a vehicle having an internal combustion engine, a fluid cooling system, and an electrical load, said system comprising:

an exhaust passage having exhaust gases flowing therein having a flow direction;

a catalytic converter having a coolant inlet and a coolant outlet and a catalytic monolith, the catalytic converter disposed in the exhaust passage and in fluid communication with the exhaust gases;

a coolant jacket disposed in an outer portion of the catalytic converter and in fluid communication with the coolant inlet and the coolant outlet to maintain the outer portion of the catalytic converter at a predetermined level;

a plurality of thermoelectric generators disposed in heat exchange relationship with the catalytic monolith and adapted for producing electrical energy when heat is transferred from the catalytic monolith to the thermoelectric generators; and a controller in electrical communication with the thermoelectric generators and the load adapted for extracting electrical energy from the thermoelectric generators and delivering the electrical energy to the load.

12. The catalytic converter system as set forth in claim 11, which further comprises:

the catalytic monolith disposed within a casing;

a layer comprised of high temperature insulation disposed around the casing;

a compression shell encased around the layer;

a plurality of fins arranged about the casing and in heat exchange relationship with the catalytic monolith and the compression shell;

a spring support shell mounted concentrically between the compression shell and the coolant jacket such that a gap is formed therebetween; and the thermoelectric generators fixedly mounted to a plurality of springs disposed within the gap such that the springs bias the thermoelectric generators against the compression shell in heat exchange relationship with fins.

13. The catalytic converter system as set forth in claim 11, which further comprises;

the catalytic monolith disposed within a casing;

a layer comprised of high temperature insulation disposed around the casing;

a compression shell encased around the layer;

a plurality of fins arranged about the casing and in heat exchange relationship with the catalytic monolith and the compression shell;

a spring support shell mounted concentrically between the compression shell and the coolant jacket such that a gap is formed therebetween;

a spring disposed within the gap producing a biasing force between the compression shell and the spring support shell; and the thermoelectric generators fixedly mounted to the spring disposed between the spring and the compression shell such that the spring biases the thermoelectric generators against the compression shell in heat exchange relationship with fins.

14. The catalytic converter system of claim 11 wherein a valve is disposed in the exhaust passage upstream of the catalytic converter.

15. The catalytic converter system of claim 11 wherein a valve is disposed in the exhaust passage downstream of the catalytic converter.

* * * * *